United States Patent
Curry, II et al.

Patent Number: 5,298,288
Date of Patent: Mar. 29, 1994

[54] COATING A HEAT CURABLE LIQUID DIELECTRIC ON A SUBSTRATE

[75] Inventors: John W. Curry, II; Douglas A. Pietila, both of Austin, Tex.

[73] Assignee: Microelectronics and Computer Technology Corporation, Austin, Tex.

[21] Appl. No.: 987,502

[22] Filed: Dec. 7, 1992

Related U.S. Application Data

[63] Continuation of Ser. No. 655,861, Feb. 14, 1991, abandoned.

[51] Int. Cl.$^5$ .......................... B05D 3/02; B05D 5/12
[52] U.S. Cl. ..................................... 427/379; 427/96; 427/420; 427/314
[58] Field of Search .................. 427/9, 96, 385.5, 379, 427/420, 389.7, 393.6, 314

[56] References Cited

U.S. PATENT DOCUMENTS

| | | | |
|---|---|---|---|
| Re. 30,789 | 11/1981 | Pilgrim et al. | 427/358 |
| 3,632,403 | 1/1972 | Greller | 427/420 |
| 4,060,649 | 11/1977 | Coleman | 427/420 |
| 4,143,187 | 3/1979 | Pilgrim et al. | 427/358 |
| 4,238,528 | 12/1980 | Angelo et al. | 427/96 |
| 4,338,349 | 7/1982 | Franklin et al. | 426/631 |
| 4,339,507 | 7/1982 | Kurtz et al. | 428/522 |
| 4,340,640 | 7/1982 | Weiner | 428/349 |
| 4,395,527 | 7/1983 | Berger | 528/26 |
| 4,522,880 | 6/1985 | Klostermeier et al. | 427/385.5 |
| 4,528,833 | 7/1985 | Inaike et al. | 427/172 |
| 4,576,857 | 3/1986 | Gannett et al. | 428/260 |
| 4,643,910 | 2/1987 | Foutz | 427/8 |
| 4,664,945 | 5/1987 | Maeda et al. | 427/96 |
| 4,696,885 | 9/1987 | Vijan | 430/311 |
| 4,699,803 | 10/1987 | Araps | 427/96 |
| 4,716,058 | 12/1987 | Morin | 427/9 |
| 4,728,531 | 3/1988 | Matz et al. | 427/379 |
| 4,752,555 | 6/1988 | Takada et al. | 430/314 |
| 4,776,997 | 10/1988 | Chino et al. | 427/9 |
| 4,794,021 | 12/1988 | Potter | 427/240 |

OTHER PUBLICATIONS

"Extrusion Coating Technology Executive Overview" by FAS Technologies, Inc., Dallas, Tex., p. 15 (Apr. 27, 1990).

"FAS-Coat Liquid Extrusion Coating System Precision Layers of High Purity Process Fluids" by FAS Technologies, Inc., Dallas, Tex., pp. 1-2 (1990) no month available.

L. M. Baker et al., "Polyimides for Dielectric Layers," (Publication unknown), AT&T Research Center, P.O. Box 900, Princeton, N.J., 08540 (no date available).

G. Smolinsky et. al., "Spin-On Dielectrics: Good News and Bad News!", Materials Research Symposium Proceedings, vol. 154, pp. 173-182 (1989) no month available.

"Polymers for Electronic Applications," edited by J. H. Lai, CRC Press, Boca Raton, Fla., pp. 33-60 (1989) no month available.

"Pyralin (TM) LX—Polyimide Coatings Processing Guidelines" by Du Pont Company, Semiconductor Materials, Barley Mill Plaza, Reynolds Mill Building, Wilmington, Del. 19989, H-12294 (May 1989).

"Pyralin (TM) LX Polyimide Coatings—Technical Data Sheet for PI-2610D and PI-2622D" by Du Pont Company, Semiconductor Materials, Barley Mill Plaza, Reynolds Mill Building, Wilmington, Del. 19898, H-12295 (Apr., 1989).

(List continued on next page.)

*Primary Examiner*—Shrive Beck
*Assistant Examiner*—Diana Dudash
*Attorney, Agent, or Firm*—David M. Sigmond

[57] ABSTRACT

A porous substrate curtain coated with a single coating of a liquid dielectric that is cured into a well adhering film at least 15 microns thick with a uniformity of less than 5 microns. The substrate is cleaned to remove contaminants, heated to remove moisture, curtain coated with a single coating of a viscous heat curable liquid dielectric such as polyimide, and heated to cure the dielectric by increasing the temperature at most 15° C. per minute to a predetermined cure temperature not exceeding 450° C. The invention is well suited for fabricating a dielectric layer in a high density multichip module.

28 Claims, 3 Drawing Sheets

OTHER PUBLICATIONS

"Hitachi Chemical Data Sheet For PIX-L110" by Hitachi Chemical Company America, Ltd. (Nov., 1990).

D. Pietila et al., "Effects of Processing Conditions on the Material Properties of Polyimide Thin Films," presented at Fall, 1990 Materials Research Symposium conference, no month available.

M. J. Berry et al., "Benzocyclobutene As A Dielectric For Multichip Module Fabrication," IEEE Electronic Components Conference, 1990, pp. 746-750, no month available.

Gretchen et al., "Effects of Polymer/Metal Interaction in Thin Film Multichip Module Applications", IEEE Electronic Components Conference, 1990, pp. 717-726, no month available.

Numata et al., "Low Thermal Expansion Polyimides and Their Applications," Materials Research Symposium Proceedings, vol. 106, 1988, pp. 113-124, no month available.

"Pyralin (TM) Polyimide Coatings—Processing Guidelines for PI-2555 as Interlayer Dielectric" by Du Pont Company, Electronics Department, Wilmington, Del., H-24267, Feb. 1990, pp. 1-2.

"Pyralin (TM) Polyimide Coatings—Semiconductor Grade Products" by Du Pont Company, Electronics Department, Wilmington, Del., H24264, Feb. 1990, pp. 1-4.

"Ultradel (TM) Update, Polyimide Coating, Process Guidelines, Ultradel 4208 and E428" by Amoco Chemical Company, HJN, Jan. 1992, pp. 1-2.

"Ultradel (TM) Update, Polyimide Coating, Process Guidelines, Ultradel 4208" by Amoco Chemical Company, Mar. 1992, pp. 1-2.

COATING A HEAT CURABLE LIQUID DIELECTRIC ON A SUBSTRATE

CROSS-REFERENCE TO RELATED APPLICATIONS

This is a continuation of U.S. Ser. No. 07/655,861 filed Feb. 14, 1991 now abandoned which is assigned to the assignee of the present invention and incorporated herein in its entirety by reference.

BACKGROUND OF THE INVENTION

1. Field of the Invention

The invention relates to applying a heat curable liquid dielectric on a substrate to form a cured dielectric film, and more particularly to coating a heat curable liquid dielectric on a substrate and then curing the dielectric by increasing the temperature at most 15° C. per minute until a predetermined cure temperature not exceeding 450° C. is reached, thereby providing from the single coating a cured dielectric film at least 15 microns thick with a uniformity of less than 5 microns.

2. Description of Related Art

Integrated circuit chips can be mounted and interconnected on high density multichip modules or substrates, for instance by tape automated bonding. Once fabricated these substrates typically comprise a top surface with bonding pads or bumps, a dielectric layer with buried electrical conductor lines to interconnect the pads, and a base beneath the dielectric for physical support. As used herein, "substrate" refers generally to any material on which a dielectric layer can be coated.

There are several conventional techniques known for coating polyimide on a substrate including spin coating, meniscus coating, spraying and dipping. Spin coating is the most common technique for depositing thin polyimide films. It is well characterized and automated spin coating —equipment is widely available. For example, a pool of liquid polyimide can be deposited on a substrate and rotated at 2000 rpm. The polyimide is radially spun out and forms a substantially uniform layer above the substrate. There are, however, several drawbacks to spin coating. Spin coating normally tends to waste approximately 80-90% of the polyimide as it is slung off the edge of the substrate. The polyimide has a tendency to bead to a greater thickness at the edge of the substrate (edge bead). Nonuniformities arise across substrates. And difficulties arise with flexible or large area substrates. Furthermore, it may be desirable to have at least 20 microns thick polyimide to reduce the line impedance of thin conductive metal traces to about 50 ohms. Producing a cured polyimide layer 15-25 microns thick by spin coating a single uncured layer typically leaves 5-7 microns of uniformity. Where better uniformity is required, for instance 1-3 microns, it becomes necessary to perform 2 or 3 separate spin coatings. This reduces throughput and increases waste since a soft bake is normally required after each spin coating to increase the viscosity of the wet film before the next coat is spun on. For instance, "Pyralin (Trademark) LX——Polyimide Coating Processing Guidelines" by Du Pont, H-12294 (May 1989) describes a multicoat of Pyralin LX used to make one thick layer. After each coating the Pyralin LX is soft baked for 30 minutes at 100° C. and then for 30 minutes at 175° C. or less before the next coating is applied.

Curtain coating (which may encompass extrusion coating) appears to be a promising alternative to spin coating. Curtain coating can be performed by using a precision fluid dispense system to pump a curtain of liquid polyimide through a narrow precision linear orifice or slit preferably the same width as the width of the substrate. The substrate is passed under this "waterfall" of polyimide at a linear velocity. The linear velocity of the substrate may exceed that of extruded polyimide in order to stretch the polyimide film over the substrate. In either case the deposited layer of wet polyimide film typically is uniform and exhibits little or no edge bead. The polyimide wasted by curtain coating as compared to spin coating can be reduced drastically, e.g. by 50-90%. In addition, unlike spin coating, the entire top surface of the substrate need not be covered with dielectric. The resultant dielectric thickness depends on several parameters, such as the dispense rate, slit thickness, substrate velocity, polyimide viscosity, shrinkage factor of the polyimide during curing, and polyimide temperature.

Initial experiments performed by Applicant to deposit a single coating and apply a constant temperature cure to form a relatively thick (at least 15 microns) cured polyimide layer on porous substrates revealed several difficulties in the final cured polyimide. Runs, streaks, crater-like texture, and separation from the substrate were observed.

Similar problems have been noted in the related art. For instance, "Polymers For Electronic Applications," edited by J. H. Lai, CRC Press, p. 40 (1989) points out that the largest practical film thickness achievable by spin coating is on the order of 15 microns; thicker films, such as required for interlayer dielectrics in integrated circuit packaging applications, are deposited with multiple coatings with a cure temperature of at least 150° C. between coats. Likewise, U.S. Pat. No. 4,395,527 by Berger entitled "Siloxane-Containing Polymers" indicates that a solution of a half-amide solvent can be applied to coat a substrate and then heated to evaporate the solvent and convert the half-amide into the corresponding polyimide. However, the coating should be built up gradually from successive layers of very thin coatings. If a thick coating is applied and heated to effect conversion of the half-amide to the imide, the water formed during the reaction can be converted to steam which tends to produce voids (broken continuity) in the coating. Further, as the imidization proceeds from the surface downward, the bottom of the coating is insulated from the heat and this makes completion of the imidization reaction difficult to achieve, or even to identify. The '527 patent then concludes that it is necessary for the user to engage in a series of coating, heating, and cooling cycles in order to develop an acceptable coating.

In addition, the related art typically describes curing the polyimide at a constant temperature. For example, in "Pyralin (Trademark) LX Polyimide Coatings——Technical Data Sheet For PI-2610D and PI-2611D" by Du Pont, H-12295 (April, 1989) the polyimide is made solid by first applying a soft bake (prebake) for 3 minutes at 140° C., and then a cure for 30 minutes at 350° C.

Therefore the related art does not teach how to fabricate from a single coating cured dielectric film at least 15 microns in thickness with a uniformity of less than 5 microns that adheres well to the substrate.

SUMMARY OF THE INVENTION

An object of the present invention is to coat a substrate with a single layer of liquid dielectric to form a cured dielectric film at least 15 microns thick with a uniformity of less than 5 microns.

A feature of the present invention is a method for coating a dielectric on a substrate, which includes applying a single coating of a heat curable liquid dielectric over the substrate, and heating the liquid dielectric at most 15° C. per minute to a predetermined cure temperature not exceeding 450° C., thereby providing from the single coating a cured dielectric film at least 15 microns thick with a uniformity of less than 5 microns which adheres to the substrate.

Another feature of the present invention is a method for coating a dielectric on a substrate including, in sequence, removing contaminants from a substrate that might otherwise substantially interfere with the adhesion or curing of a dielectric on the substrate; heating the substrate to remove moisture that might otherwise substantially interfere with the adhesion or curing of a dielectric on the substrate; curtain coating the substrate with a single coating of a heat curable liquid dielectric before the substrate receives sufficient contaminants or absorbs sufficient moisture to substantially interfere with adhesion or curing of the dielectric, including i) forcing the liquid dielectric through a slit in a dispenser spaced above the substrate onto the substrate, and ii) moving the substrate linearly with respect to the dispenser so that the liquid dielectric is deposited on the substrate; and heating the liquid dielectric at most 15° C. per minute to a predetermined cure temperature not exceeding 450° C., thereby providing from the single coating a cured dielectric film at least 15 microns thick with a uniformity of less than 5 microns which adheres to the substrate.

Still another feature of the present invention is wherein the dielectric is a polymeric material such as polyimide.

Another feature of the present invention is wherein the substrate is porous.

Yet another feature of the present invention is wherein the cured dielectric is at least 20 microns thick with a uniformity not exceeding 3 microns.

An additional feature of the present invention is wherein the cured dielectric film is at least 15 microns thick with a uniformity not exceeding 8% of the maximum thickness.

An advantage of the present invention is the maximization of throughput as substrates are covered with a cured dielectric, as well as relatively high uniformity of the dielectric thicknesses.

Another advantage of the present invention is the minimization of dielectric waste, edge bead, and surface nonuniformity.

These and other objects, features and advantages of the present invention will be more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
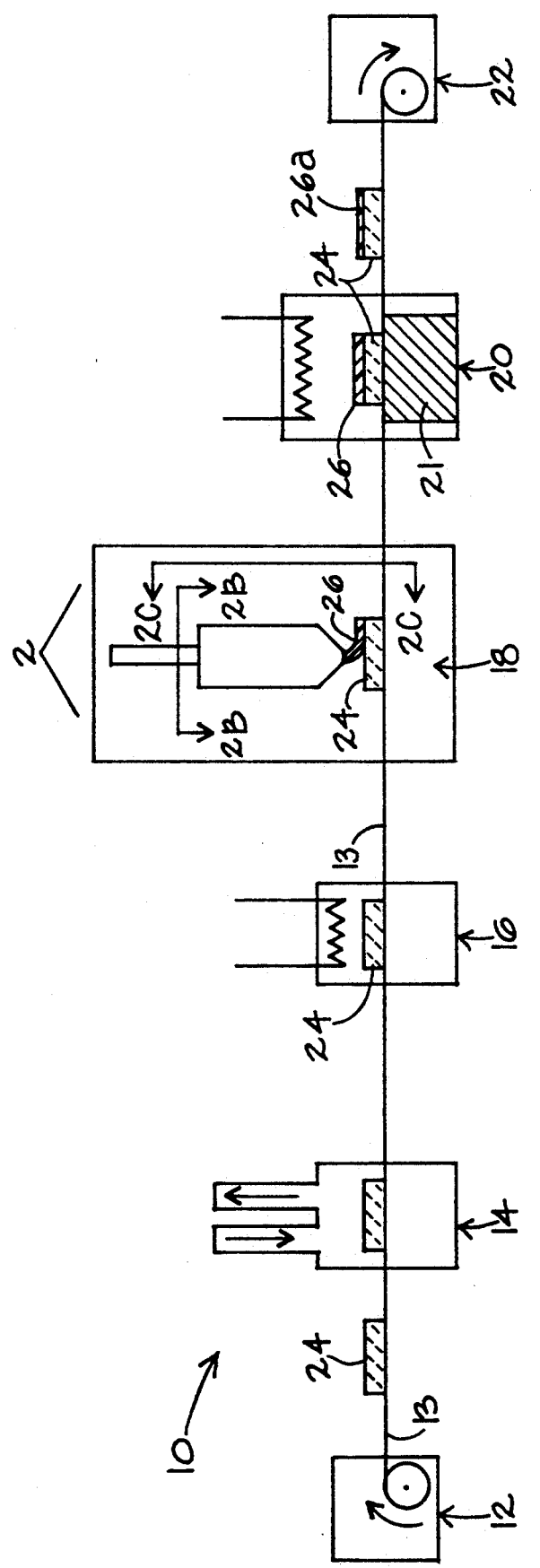
FIG. 1 shows an elevational, partially schematic view of a system wherein a porous substrate is cleaned, baked, curtain coated with a heat curable liquid dielectric, and then cured in accordance with the present invention.

Referring now to the drawings wherein depicted elements are not necessarily shown to scale and wherein like or similar elements are designated by the same reference numeral through the several views and, more particularly to FIG. 1, there is shown a curtain coating system generally designated 10 according to a particularly preferred exemplification of the invention.

A porous substrate 24 such as a 4 inch round ceramic base exits input bin 12 on conveyor track 13. It may be beneficial to place substrate 24 in a recessed chuck (not shown) to control coating edge effects such as edge bead. Substrate 24 enters cleaning chamber 14 which removes contaminants such as water, oils and organics from the top surface of substrate 24 that might otherwise substantially interfere with the adhesion or curing of a dielectric to later be applied to the top of the substrate.

After being cleaned, substrate 24 is placed in heating chamber 16 and exposed to a dehydration bake at 350° C. for 1 hour to remove moisture from substrate 24 that might otherwise substantially interfere with the adhesion or curing of the dielectric to later be applied to the top of the substrate. An adequate dehydration bake generally required heating the substrate above 200° C. for at least 1 hour.

Thereafter substrate 24 is sent to curtain coater 18 to apply a single coating of a heat curable liquid dielectric on substrate 24. The dielectric is preferably a polymer, and more preferably polyimide. The literature on polyimides is extensive and numerous heat curable liquid polyimides formulated for electronic component fabrication are commercially available. Other potentially suitable dielectrics include polyimidesiloxanes, polyhydrocarbons, polysilicates, polysiloxanes, and polysilsesquioxanes (the later three silicon compounds are often referred to as spin-on glasses). See G. Smolinsky et. al., "Spin-On Dielectrics: Good News and Bad News!", *Materials Research Symposium Proceedings*, Vol. 154 (1989). Curtain coating is preferred over spin coating for the reasons described, supra, most notably due to the large portion of dielectric that is slung off the rotating substrate and wasted during spin coating. However, it is understood that spin coating can be used in accordance with the present invention to form from a single coating a cured dielectric film at least 15 microns thick with a uniformity of less than 5 microns which adheres to the substrate. Between dehydration bake and curtain coating, substrate 24 must be prevented from receiving contaminants or absorbing moisture sufficient to substantially interfere with the adhesion or curing of the dielectric to be applied.

Techniques and apparatus related to curtain coating a viscous dielectric onto a substrate are known to those having skill in the art and will not be described in detail herein; see, for instance, U.S. Pat. No. 4,696,885 which issued in September, 1987 to Vijan; "FAS-Coat Liquid Extrusion Coating System Precision Layers of High Purity Process Fluids" published by FAS Technologies Inc. of Dallas, Tex. (1990); and "Extrusion Coating Technology Executive Overview" published by FAS Technologies Inc. (1990). Each of these references is hereby incorporated in its entirety by reference.

Figure 2A:
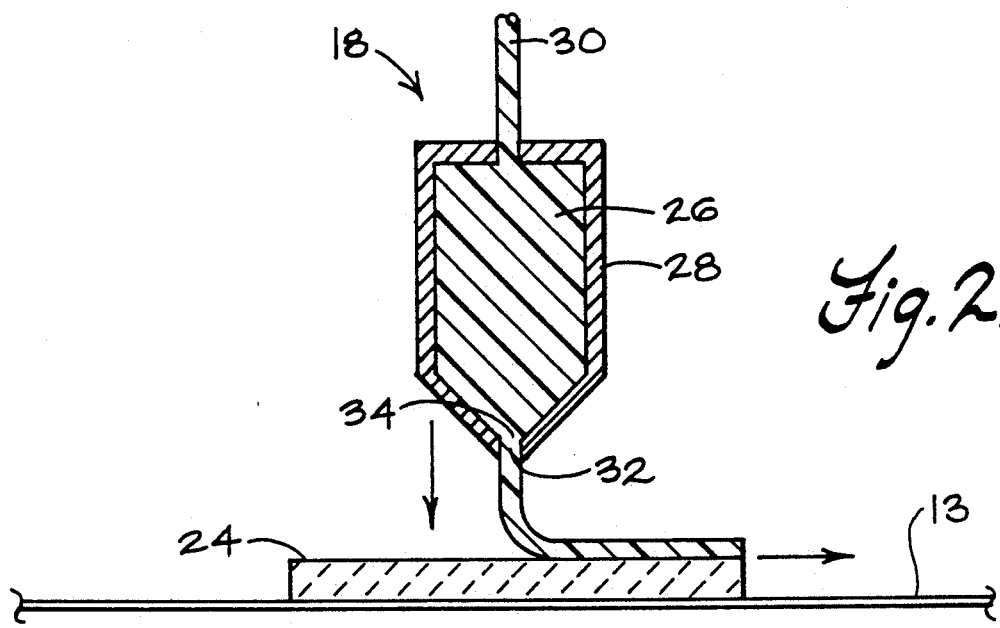
FIG. 2A shows a detailed elevational sectional view of region 2 in FIG. 1.

FIG. 2A shows a detailed cross-sectional view of curtain coater 18 in region 2 of FIG. 1. Hitachi L110 130 poise liquid polyimide 26 with approximately 12% solids is fed into dispenser 28 by feed line 30 at a rate of 1 cc per second. Relying on gravity will not suffice, liquid polyimide 26 is viscous and therefore must be pumped through line 30 into dispenser 28 and out through slit 32. (Other dielectrics such as spin-on glasses are typically formulated in solutions filled with fluid and can be pressure dispensed.) When polyimide 26 initially flows through slit 32 it may be necessary to briefly wait, for instance 13 seconds, to allow the dispensed polyimide curtain to stabilize. Dispenser 28 is spaced in close proximity to substrate 24, for instance 0.008 inches. For illustration purposes dispenser 28 is not close enough to contact or scrape the top of the liquid polyimide 26 deposited on substrate 24. Alternatively, if desired, dispenser 28 can be positioned sufficiently close to substrate 24 to assure that as polyimide 26 is deposited on substrate 24 the dispenser 28 will contact and scrape the top of the deposited layer of polyimide 26. This will result in spreading and planarizing the deposited layer of polyimide 26 as dispenser 28 functions as a doctor blade. Returning to the present example, a 20 micron cured film of polyimide 26 is formed. However, the present invention is well suited for applying a cured dielectric layer at least as thick as 25 microns. Since liquid polyimide 26 contains approximately 12% solids it becomes necessary to apply an approximately 200 micron layer of uncured liquid polyimide in order to form a 20 micron cured polyimide layer. Further details about the relationship between the molecular weight and the final cured thickness of a polymer are discussed in "Polyimide For Dielectric Layers" by L. M. Baker et. al. of AT&T Engineering Research Center, P.O Box 900, Princeton, N.J. 08540.

Substrate 24 moves on conveyor track 13 at a steady linear speed of 1.3 inches per second as polyimide 26 exits through thin slit 32. Polyimide 26 is discharged from dispenser 28, is deposited on the top surface of substrate 24, and forms a substantially continuous viscous layer that maintains its form and integrity between its discharge from dispenser 28 and its deposition on the top surface of substrate 24.

Figure 2B:
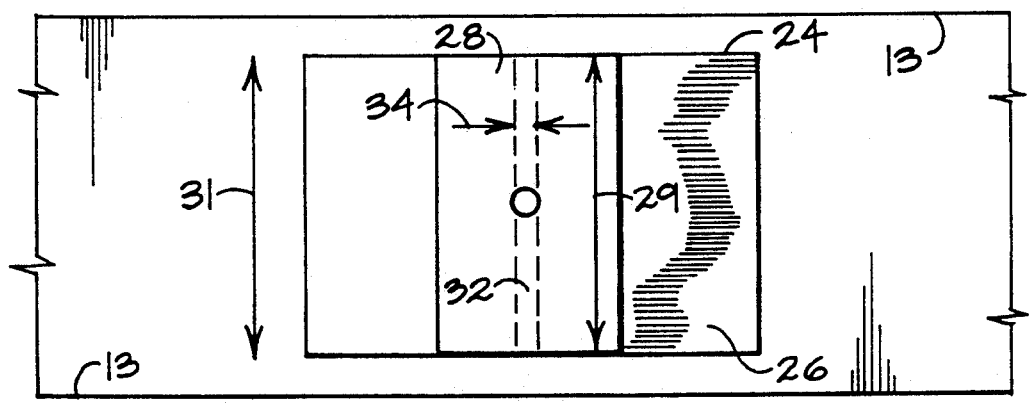
FIG. 2B shows a detailed top plan view of region 2 taken across line 2B—2B in FIG. 1.

FIG. 2B shows a detailed top plan view of region 2 taken along line 2B—2B of FIG. 1. The width 29 of dispenser 28 is equal to the width 31 of substrate 24 in order to coat the entire top surface of substrate 24 while minimizing wasted polyimide. Polyimide 26 is dispensed through slit 32 with an opening width 34 of 0.010 inches.

Figure 2C:
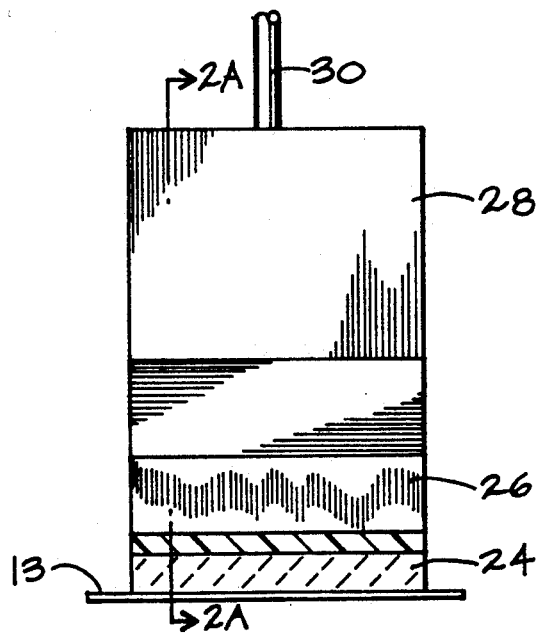
FIG. 2C shows a detailed front view of region 2 taken across line 2C—2C in FIG. 1.
Figure 2D:
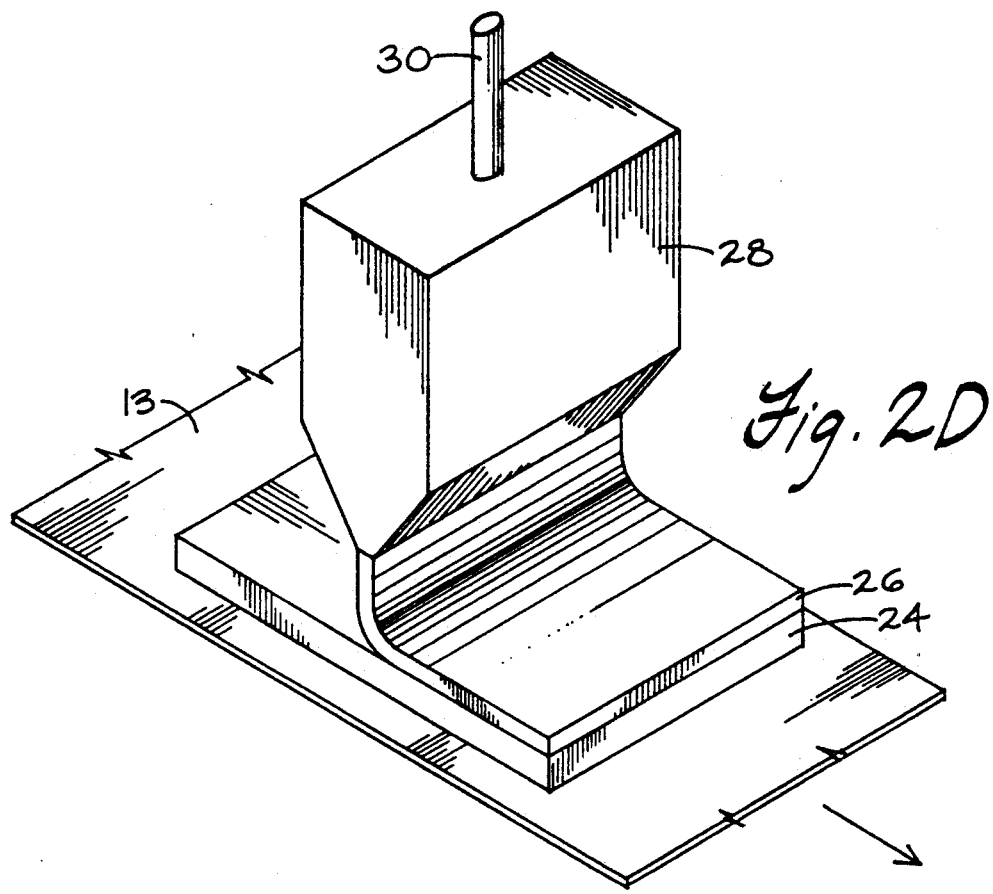
FIG. 2D shows a detailed perspective view of region 2 in FIG. 1.

FIG. 2C shows an detailed front view of region 2 taken along line 2C—2C of FIG. 1 to further illustrate the curtain coating step. No substantial amount of edge bead is formed. In FIG. 2D a perspective view of region 2 is shown.

It should be noted that several differences exist between the curtain coating in the preferred embodiment of the present invention and the extrusion coating taught in previously mentioned U.S. Pat. No. 4,696,885. The preferred embodiment dispenses polyimide in a direction substantially normal to the substrate surface to be covered and perpendicular to the direction of motion of the substrate, whereas the '885 patent shows a fluid viscous composition (of photoresist) dispensed in the direction of substrate travel and parallel to the substrate surface to be coated. An additional difference is that the preferred embodiment may or may not dispense the polyimide at a slow enough rate to allow the polyimide to be drawn down and stretched by the substrate, whereas in the '885 the viscous composition is dispensed at a velocity less than the velocity of the substrate so that the viscous composition is drawn down and stretched by the substrate.

Referring again to FIG. 1, after substrate 24 has been coated with an approximately 200 micron thick wet layer of polyimide 26 it is necessary to cure the liquid polyimide 26 into a dry polyimide film 26a. Substrate 24 is next fed into curing oven 20 and positioned in heat exchange relationship with hot plate 21. Applicant has found that exposing polyimide wet film 26 to a constant temperature cure failed to provide acceptable results. At 110° C. and higher the continuity of the polyimide was broken. At 80° C. the soft bake took four hours to complete (i.e. remove tackiness from the film) which was considered too slow for manufacturing purposes. Applicant was able to achieve a well cured and adhering dielectric film 26a at least 15 microns thick with a uniformity of less than 5 microns in an acceptable time period by ramping-up the temperature of the wet polyimide film at most 15° C. per minute until a cure temperature not exceeding 450° C. was reached, preferably in the range of 300°–400° C. Upon reaching the cure temperature it was unnecessary to maintain the cure temperature since the polyimide film was suitably cured. Consequently, as soon as the cure temperature was reached, the heating was discontinued and the substrate was gradually cooled for 150 minutes to room temperature.

Cure rates below 1° C. per minute are generally considered too slow for manufacturing purposes and therefore are not preferred. Nonetheless, it is conceivable that a ramp and soak time-temperature relationship may be well suited for heating a curable liquid dielectric which contains a high content of moisture or solvents. In this case, a constant temperature soak used for evaporating the moisture or solvents may result in a cure rate below 1° C. per minute by the time the predetermined cure temperature is reached.

Cure rates above 15° C. per minute are likely to create too much stress on the polyimide to assure a desirable coating. Generally 6° C. per minute is considered the maximum preferable cure rate. Notwithstanding, Applicant has reduced the present invention to practice with the cure rates as high as 10° C. per minute (the maximum speed available on Applicant's equipment). Furthemore, Applicant predicts that cure rates as high as 15° C. per minute can be used for the present invention.

Figure 3:
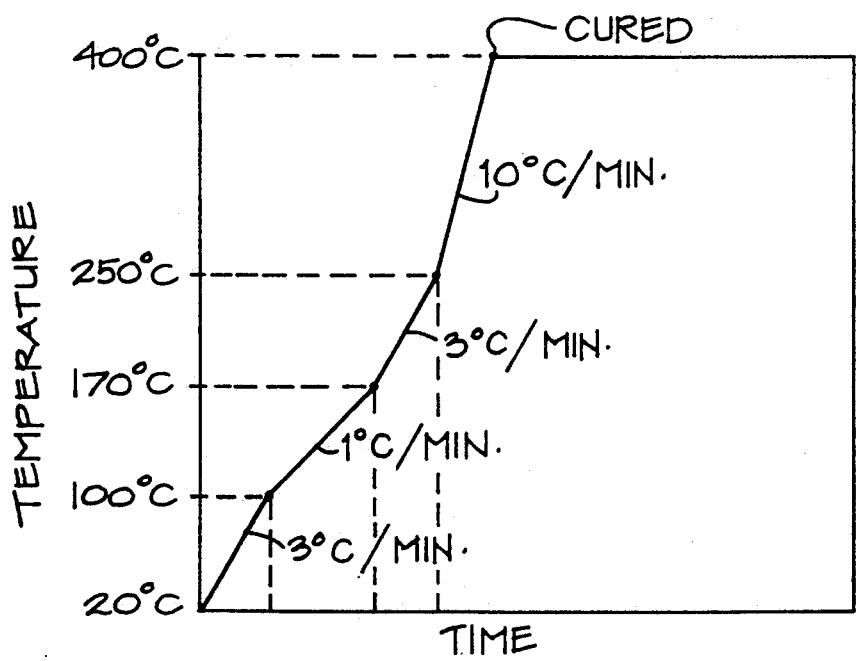
FIG. 3 shows a time/temperature relationship graph for heat curing a liquid dielectric.

Referring now to the graph in FIG. 3, the preferred curing time/temperature relationship for producing a 20 micron cured film from an approximately 200 micron thick wet layer of low stress Hitachi L110 polyimide was found to be: 1) increase the temperature from room temperature to 100° C. at 3° C. per minute; 2) increase the temperature from 100° C. to 170° C. at 1° C. per minute; 3) increase the temperature from 170° C. to 250°

C. at 3° C. per minute; and 4) increase the temperature from 250° C. to 400° C. at 10° C. per minute wherein at 400° C. the polyimide is cured. Under different conditions the optimal time/temperature curing parameters may need to be adjusted, depending on factors such as the desired thickness of the cured film and the percentage of solids in the liquid dielectric.

Referring once again to FIG. 1, after curing, a dry 20 micron polyimide film 26a has a uniformity of less than 5 microns, and more preferably at most 3 microns. There is no substantial edge bead. In addition, cured polyimide film 26a adheres well to substrate 24. Thereafter substrate 24 is deposited into output bin 22.

Experiments performed by the Applicant in accordance with the present invention have produced from a single coating of liquid dielectric a cured dielectric film over 15 microns thick with a total surface nonuniformity not exceeding 8% of the maximum thickness. In one experiment a single coating of Hitachi L110 130 poise liquid polyimide was curtain coated on a ceramic substrate and then heated to form a 23 micron thick cured dielectric film with a surface nonuniformity not exceeding 8% of 23 microns. In a separate experiment a single coating of Du Pont 2611 130 poise liquid polyimide was curtain coated on a silicon substrate and then heated to form a 26 micron thick cured dielectric film with a uniformity not exceeding 12% of 26 microns. Furthermore, in both experiments, with edge exclusion, the uniformity did not exceed 7% of the maximum thickness of the cured dielectric film.

The preceding preferred embodiments are described for illustration purposes and numerous substitutions will be apparent to those having skill in the art. For instance, the exact substrate cleaning technique and the exact exposure time and heat for the substrate moisture bake may be found by routine experimentation. The substrate need not be porous. Other porous substrates include aluminum nitride (AlN) and aluminum oxide (Al2O3). The liquid dielectric can be applied over the substrate by other techniques, such as spin coating, meniscus coating, dipping, spraying, or scrapping a layer of liquid dielectric with a doctor blade. Other viscous heat curable liquid dielectrics include polymeric materials such as photoimagible polyimide. Another exemplary polyimide is 130 poise Du Pont 2611. Relative motion between the dispenser and substrate can be accomplished with a stationary substrate and movable dispenser. The width of the dispenser need not equal the width of the substrate, and if the dispenser width exceeds the substrate width the excess polyimide can be captured by a capture mechanism beneath the substrate and recycled for further use.

Other changes and modifications in the specifically described embodiments can be carried out without departing from the scope of the invention which is intended to be limited only by the scope of the appended claims.

What is claimed is:

1. A method for coating a polymeric dielectric on a substrate, comprising the following steps:
   applying a single coating of a heat curable liquid polymeric dielectric over the substrate; and
   heating the liquid polymeric dielectric at most 15° C. per minute to a cure temperature above 225° C. but not exceeding 450° C., thereby providing from the single coating a cured polymeric dielectric film at least 15 microns thick with a uniformity of less than 5 microns which adheres to the substrate.

2. A method for coating a polymeric dielectric on a substrate, comprising the following steps in the sequences set forth:
   removing contaminants from the substrate that might otherwise substantially interfere with adhesion or curing of said polymeric dielectric on the substrate;
   heating the substrate to remove moisture that might otherwise substantially interfere with the adhesion or curing of said polymeric dielectric on the substrate;
   depositing a single coating of a liquid polymeric dielectric on the substrate before the substrate receives sufficient contaminants or absorbs sufficient moisture to substantially interfere with the adhesion or curing of the polymeric dielectric; and
   heating the liquid polymeric dielectric at most 15° C. per minute to a cure temperature about 225° C. but not exceeding 450° C., thereby providing from the single coating a cured polymeric dielectric film at least 15 microns thick with a uniformity of less than 5 microns which adheres to the substrate.

3. The method of claim 2 wherein the substrate is selected from the group consisting of ceramics, aluminum nitride, and aluminum oxide.

4. The method of claim 2 wherein the substrate is porous.

5. The method of claim 2 wherein during heating the substrate to remove moisture the substrate is heated above 200 ° C. for at least 1 hour.

6. The method of claim 2 wherein the liquid polymeric dielectric is heated to the cure temperature by
   1) increasing the temperature from room temperature to 100° C. at 3° C. per minute;
   2) increasing the temperature from 100° C. to 170° C. at 1° C. per minute;
   3) increasing the temperature from 170° C. to 250° C. at 3° C. per minute; and
   4) increasing the temperature from 250° C. to 400° C. at 10° C. per minute wherein at 400° C. the polymeric dielectric is cured.

7. The method of claim 6 wherein the liquid polymeric dielectric is polyimide.

8. The method of claim 7 wherein the polyimide has a viscosity of 130 poise before curing.

9. The method of claim 2 wherein the cured polymeric dielectric film is at least 20 microns thick and has a uniformity not exceeding 3 microns.

10. The method of claim 2 wherein the liquid polymeric dielectric is heated at most 10° C. per minute.

11. The method of claim 2 wherein the liquid polymeric dielectric is heated between 1°-6° C. per minute.

12. The method of claim 2 wherein the liquid polymeric dielectric is coated by curtain coating.

13. The method of claim 2, wherein
   the substrate is porous,
   the polymeric dielectric is polyimide, and
   the cured polyimide film is at least 20 microns thick with a uniformity not exceeding 3 microns.

14. A method for coating a polymeric dielectric on a substrate, comprising the following steps:
   removing contaminants from the substrate that might otherwise substantially interfere with adhesion or curing of the polymeric dielectric on the substrate;
   heating the substrate to remove moisture that might otherwise substantially interfere with the adhesion or curing of the polymeric dielectric on the substrate;

curtain coating the substrate with a single coating of a heat curable liquid polymeric dielectric before the substrate receives sufficient contaminants or absorbs sufficient moisture to substantially interfere with the adhesion or curing of the polymer dielectric, said curtain coating including
  i) forcing the liquid polymeric dielectric through a slit in a dispenser spaced above the substrate onto the substrate, and
  ii) moving the substrate linearly with respect to the dispenser so that the liquid polymeric dielectric is deposited on the entire substrate; and
heating the liquid polymer dielectric at most 15° C. per minute to a cure temperature above 225° C. but not exceeding 450° C., thereby providing from the single coating a cured polymeric dielectric film at least 15 microns thick with a uniformity of less than 5 microns which adheres to the substrate.

15. The method of claim 14 wherein the dispenser is in close proximity but spaced from the substrate in order to form a flexible continuous layer of liquid polymeric dielectric on the substrate without the dispenser contacting said layer.

16. The method of claim 14 wherein the dispenser is in close proximity but spaced from the substrate in order to form a flexible continuous layer of liquid polymeric dielectric on the substrate wherein the dispenser contacts and scrapes said layer.

17. The method of claim 14 wherein the polymeric dielectric is dispensed through the slit in a direction substantially perpendicular to the linear motion of the substrate with respect to the dispenser.

18. The method of claim 2 wherein the cured polymeric dielectric film is at least 15 microns thick with the uniformity not exceeding 8% of a maximum thickness of the cured polymeric dielectric film.

19. The method of claim 18 wherein the polymeric dielectric is polyimide and is curtain coated on a ceramic substrate.

20. The method of claim 18 wherein the liquid polymeric dielectric is heated at most 10° C. per minute.

21. The method of claim 2 wherein the liquid polymeric dielectric is heated to a predetermined cure temperature above 225° C.

22. The method of claim 2 wherein the liquid polymeric dielectric is heated to a cure temperature above 400° C.

23. The method of claim 2 wherein the liquid polymeric dielectric is heated at least two different rates of temperature increase.

24. The method of claim 23 wherein the at least two different rates of temperature increase differ by at least 2° C. per minute.

25. The method of claim 2 wherein the liquid polymeric dielectric is heated at least three different rates of temperature increase, a first rate being greater than a second rate a third rate being greater than the first rate.

26. A method for coating a polymeric dielectric on a substrate, comprising the following steps:
  applying a single coating of a heat curable liquid polymeric dielectric over the substrate; and
  heating the liquid polymeric dielectric at most 15° C. per minute to a cure temperature about 170° C. but not exceeding 450° C., wherein the liquid polymeric dielectric is heated at least three different rates of temperature increase, a before first rate being greater than a second rate, the third rate being greater than the first rate, thereby providing from the single coating a cured polymeric dielectric film at least 15 microns thick with a uniformity of less than 5 microns which adheres to the substrate.

27. A method for coating a polymeric dielectric on a substrate, comprising the following steps in the sequence set forth:
  removing contaminants from the substrate that might otherwise substantially interfere with adhesion or curing of the polymeric dielectric on the substrate;
  heating the substrate to remove moisture that might otherwise substantially interfere with the adhesion or curing of the polymeric dielectric on the substrate;
  depositing a single coating of a liquid polymeric dielectric on the substrate before the substrate receives sufficient contaminants or absorbs sufficient moisture to substantially interfere with the adhesion or curing of the polymeric dielectric; and
  heating the liquid polymeric dielectric at most 15° C. per minute to a cure temperature about 170° C. but not exceeding 450° C., wherein the liquid polymeric dielectric is heated at least three different rates of temperature increase, a first rate being greater than a second rate, a third rate being greater than the first rate, thereby providing from the single coating a cured polymeric dielectric film at least 15 microns thick with a uniformity of less than 5 microns which adheres to the substrate.

28. A method for coating a polymeric dielectric on a substrate, comprising the following steps:
  removing contaminants from the substrate that might otherwise substantially interfere with adhesion or curing of the polymeric dielectric on the substrate;
  heating the substrate to remove moisture that might otherwise substantially interfere with the adhesion or curing of the polymeric dielectric on the substrate;
  curtain coating the substrate with a single coating of a heat curable liquid polymeric dielectric before the substrate receives sufficient contaminants or absorbs sufficient moisture to substantially interfere with the adhesion or curing of the polymeric dielectric, said curtain coating including
    i) forcing the liquid polymeric dielectric through a slit in a dispenser spaced above the substrate onto the substrate, and
    ii) moving the substrate linearly with respect to the dispenser so that the liquid polymeric dielectric is deposited on the entire substrate; and
  heating the liquid polymeric dielectric at most 15° C. per minute to a cure temperature above 170° C. but not exceeding 450° C., wherein the liquid polymeric dielectric is heated at least three different rates of temperature increase, a first rate being greater than a second rate, a third rate being greater than the first rate, thereby providing from the single coating a cured polymeric dielectric film at least 15 microns thick with a uniformity of less than 5 microns which adheres to the substrate.

* * * * *